United States Patent
Chen et al.

(10) Patent No.: US 7,924,596 B2
(45) Date of Patent: Apr. 12, 2011

(54) AREA EFFICIENT PROGRAMMABLE READ ONLY MEMORY (PROM) ARRAY

(75) Inventors: Zhanping Chen, Portland, OR (US); Kevin Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 495 days.

(21) Appl. No.: 11/861,293

(22) Filed: Sep. 26, 2007

(65) Prior Publication Data
US 2009/0080232 A1    Mar. 26, 2009

(51) Int. Cl.
*G11C 17/00* (2006.01)
(52) U.S. Cl. ............................. 365/96; 365/94; 365/227
(58) Field of Classification Search .................. 365/96, 365/94, 227
See application file for complete search history.

(56) References Cited

U.S. PATENT DOCUMENTS

| | | | | |
|---|---|---|---|---|
| 5,706,231 A * | 1/1998 | Kokubo | ........................ | 365/200 |
| 6,704,236 B2 * | 3/2004 | Buer et al. | ............... | 365/210.13 |
| 2007/0030719 A1 * | 2/2007 | Hoefler et al. | ................... | 365/94 |
| 2007/0195574 A1 * | 8/2007 | Mabuchi | ........................ | 365/94 |
| 2008/0198642 A1 * | 8/2008 | Ito | .................................. | 365/96 |

* cited by examiner

*Primary Examiner* — Vu A Le
*Assistant Examiner* — Han Yang
(74) *Attorney, Agent, or Firm* — Kacvinsky Daisak PLLC

(57) ABSTRACT

A programmable ROM (PROM) architecture includes cascode NMOS transistors with a fuse bit cell that is arrayed, with sleep transistors located in each column of the array that in a standby mode shut down the entire fuse array. A fuse redundancy scheme may be used to repair a defective fuse row.

21 Claims, 5 Drawing Sheets

AREA EFFICIENT PROGRAMMABLE READ ONLY MEMORY (PROM) ARRAY

Developments in a number of different digital technologies have greatly increased the need to store data. Technological developments permit digitization and compression of large amounts of voice, video, imaging, and data information. Embedded memory yield dominates manufacturing yield of a chip and yield enhancement techniques for embedded memories are important for entire chip yield increase. Thus, with the amounts of data that devices store, enhancements to repair the memories on the chip are needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
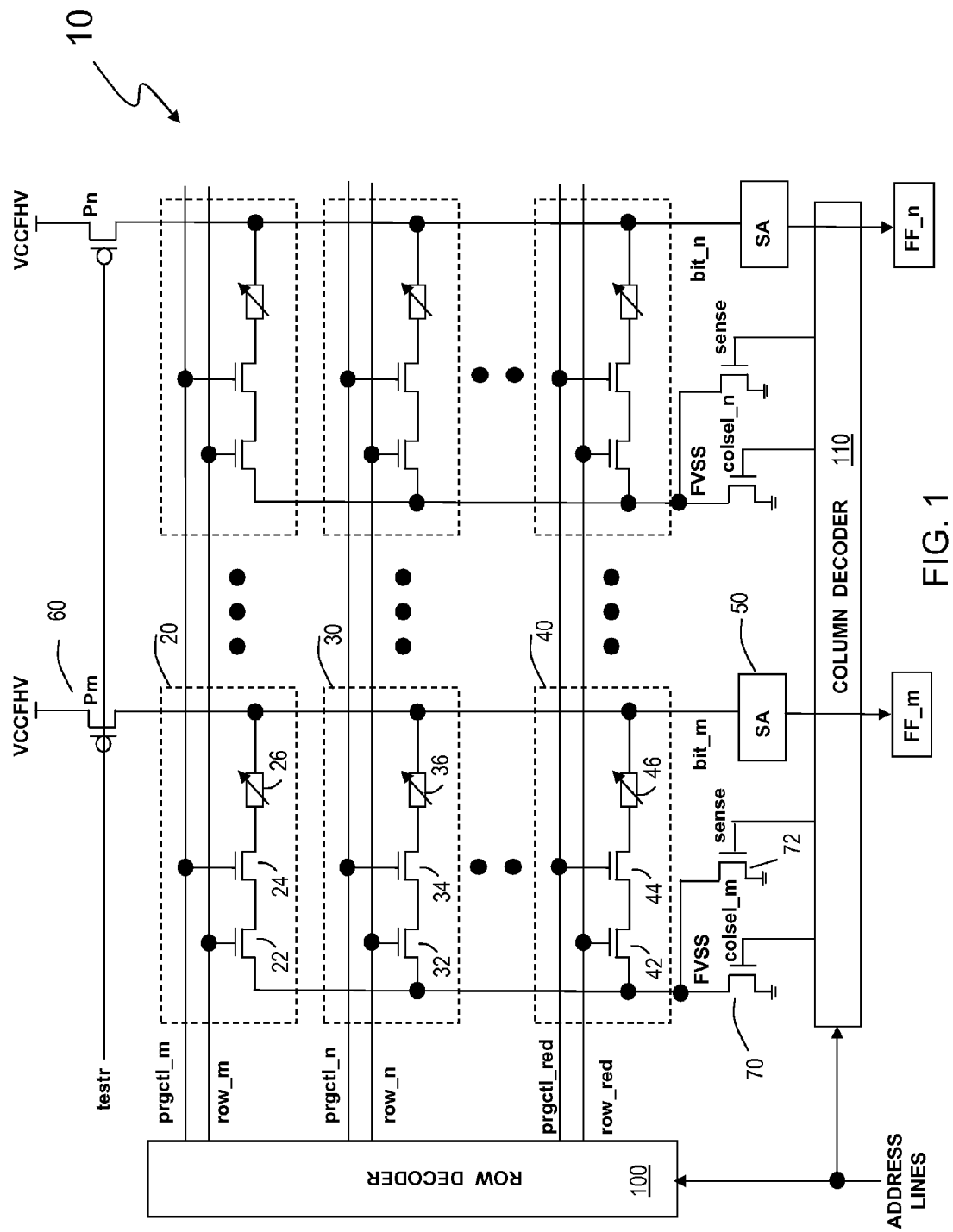
FIG. 1 is a diagram that shows a programmable ROM (PROM) architecture that includes an array of fuse bit cells in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The present invention may be used with a multi-core or a single core processor in a variety of products, with the claimed subject matter incorporated into wireless products as well as desktop computers, laptops, smart phones, MP3 players, cameras, communicators and Personal Digital Assistants (PDAs), medical or biotech equipment, automotive safety and protective equipment, automotive infotainment products, etc. However, it should be understood that the scope of the present invention is not limited to these examples.

FIG. 1 is a programmable ROM (PROM) 10 architecture in accordance with the present invention that includes an array of fuse bit cells arranged in rows and columns. The simplistic embodiment showing the fuse array architecture receives address lines into a row decoding logic circuit 100 and a column decoding logic circuit 110 to select particular fuse bit cells for programming and for reading. One row of the array is read at a time which allows the fuse bit cells located in each column to share the sensing circuitry for the programmable fuse element. Although not shown, note that row decoding logic circuit 100 and column decoding logic circuit 110 may be implemented using scan flip-flops to provide the desired coding.

Each column in the array includes fuse bit cells selected by row select signals, a sleep PMOS transistor controlled by a "testr" signal, a first sleep NMOS transistor controlled by a column select "colsel" signal, a second sleep NMOS transistor controlled by a column "sense" signal, and an analog single-ended Sense Amplifier (SA). As specifically illustrated in the figure, each fuse bit cell includes two cascode NMOS program transistors and one programmable fuse element. Accordingly, fuse bit cell 20 has cascade program transistors 22 and 24 in series with a fuse element 26; fuse bit cell 30 has cascade program transistors 32 and 34 and fuse element 36; and fuse bit cell 40 has cascade program transistors 42 and 44 and fuse element 46. It should be pointed out that although the embodiments of the PROM architecture illustrate the fuse bit cell as having two cascode NMOS program transistors and a programmable fuse element, other embodiments may have only one NMOS, one PMOS, or other special device such as Vertical Drain NMOS (VDNMOS) program transistor that is tolerant of a higher voltage with the fuse element.

Fuse bit cells 20, 30, . . . , and 40 in one column of PROM 10 commonly share a bit line that is connected to sense amplifier 50 and further connected to a sleep PMOS transistor 60. The fuse bit cells 20, 30, . . . , and 40 in the column of PROM 10 also commonly share a line labeled "FVSS" that connects the drain of a sleep NMOS transistor 70 with transistors 22, 32, and 42 in the respective fuse bit cells 20, 30, . . . . and 40. With PROM 10 operating in a standby mode, the sleep transistors, i.e., sleep PMOS transistor 60 and the sleep NMOS transistors 70 and 72 cooperate to eliminate a leakage path in each of the fuse bit cells 20, 30, . . . , and 40. Thus, sleep transistors 60, 70, and 72 as well as the other sleep transistors located in each column of the array can be used in a standby mode to shut down the entire fuse array and dramatically reduce the array leakage current.

In a program operation, a fuse in a selected fuse bit cell may be programmed by providing various potentials and signals within PROM 10. For example, fuse element 26 in fuse bit cell 20 may be selected by the row decoder 100 generating the row select "row_m" that is supplied to the gate of NMOS transistor 22; and further generating the column select "colsel_m" in the column decoder 110 that is supplied to the gate of sleep NMOS transistor 70. Further, the signal line "testr" connected to the gate of the sleep PMOS transistor 60 is supplied a potential of VCC, and the source of that transistor is connected to the power conductor VCCFHV and receives a potential that may be higher than VCC. In addition, the gate of NMOS transistor 24 is controlled by the programming signal "prgctl_m" that is held at a potential of VCC during programming. With sleep transistors 60 and 70 biased to an active state and with the fuse bit cell 20 selected by signals from row decoder 100 and column decoder 110, fuse element 26 conducts a current and is programmed to create a large post-burn resistance. Note that sleep transistor 70 is only conductive during the program operation. It should be noted that multiple cells can be programmed at the same time when multiple row select signals are enabled from row decoder 100.

In a read operation, a fuse in the selected fuse bit cell may be sensed by also providing various potentials and signals within PROM 10. For example, fuse element 26 in fuse bit cell 20 may be selected by generating the row select "row_m" in the row decoder 100 that is supplied to the gate of NMOS transistor 22; and further generating the "sense" signal in the column decoder 110 that is supplied to the gate of sleep NMOS transistor 72. The power conductor VCCFHV is supplied with a voltage potential of VCC, while the gate of the sleep PMOS transistor 60 that receives the signal "testr" is maintained at the potential of VCC to bias that transistor in an "off" state. Sense amplifier 50 is gated active to respond to sensing the programmed value of fuse element 26 in fuse bit cell 20. Note that sleep transistor 72 is only conductive during the read operation when the fuse in the selected fuse bit cell is sensed. Further note that in an alternate embodiment that the function of sleep NMOS transistor 70 and sleep NMOS transistor 72 may be handled by a single transistor.

The cascode NMOS transistors in the fuse bit cells such as, for example, transistors 22 and 24 in fuse bit cell 20; transistors 32 and 34 in fuse bit cell 30; and transistors 42 and 44 in fuse bit cell 40; enable high voltage programming. When a row select is not enabled and/or a column select is not enabled, the fuse bit cell is not selected and the common node bit in the fuse bit cell can be at a high voltage potential of 2VCC. Then, with the gate of the prgctl-controlled NMOS transistor 24 at a voltage potential of VCC, the drain of that transistor can be at 2VCC while its source can only be VCC-Vth. This eliminates any possible reliability concerns during high voltage programming.

Whereas current PROM (fuse) technology is based on fuse cells with a built-in sense amplifier, margin control, and program MUX circuitry that leads to a large cell area, the present invention utilizes an area efficient cell having two cascode NMOS program transistors and one programmable fuse element. New applications such as key encoding may require thousands and even tens of thousands of fuse cells, so an area efficient cell improves the fuse yield.

Figure 2:
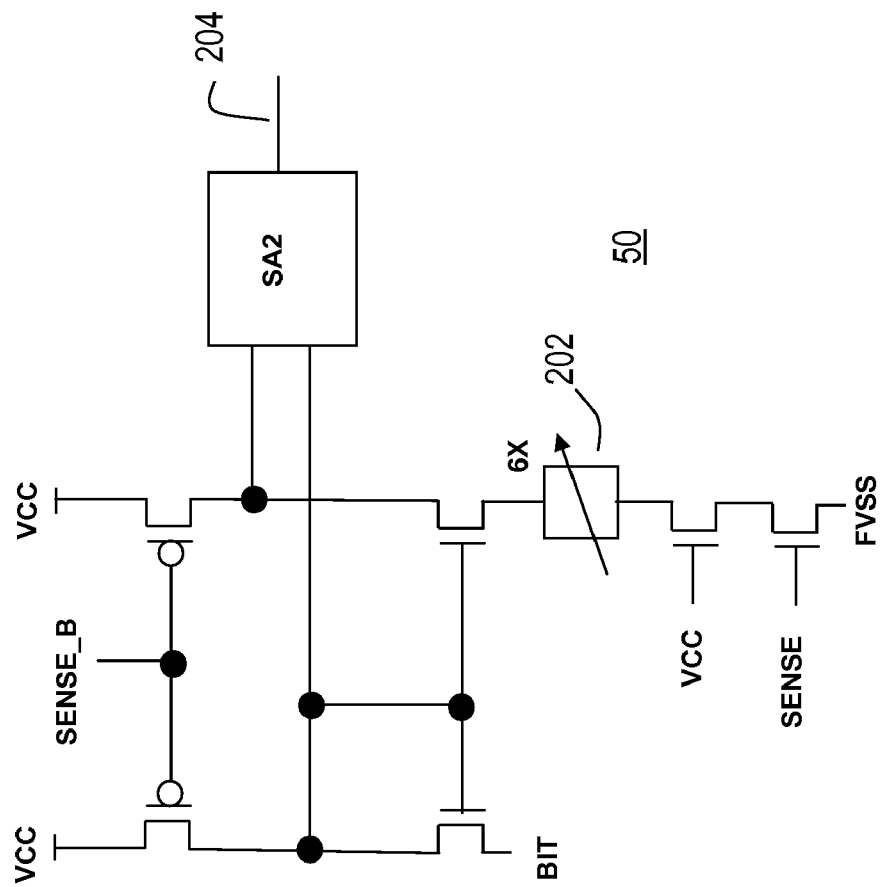
FIG. 2 illustrates a single-ended Sense Amp (SA) that receives a bit sensed signal of a fuse resistance from a selected fuse bit cell to compare with a reference fuse resistance.

FIG. 2 illustrates a single-ended Sense Amp (SA) 50 that receives the signal "bit_m" sensed from one of the selected fuse bit cells 20, 30, . . . , 40. Sense amp 50 compares the sensed fuse resistance in the selected fuse bit cell with the reference fuse resistance provided by fuse element 202 to provide the digital output 204. All fuse bit cells in the same row of the array may be read at the same time since each fuse element in that row is sensed by a different sense amplifier and compared against a reference fuse inside that sense amplifier. The digital value from sense amplifier 50 may be stored in a digital storage device (see FIG. 1). Note that the reference resistance of fuse element 202 that is labeled "6x" can be implemented by stacking the same fuse element multiple times, or alternatively, using a different reference resistor or skewing one or more sensing transistors in the sense amplifier.

Figure 3:
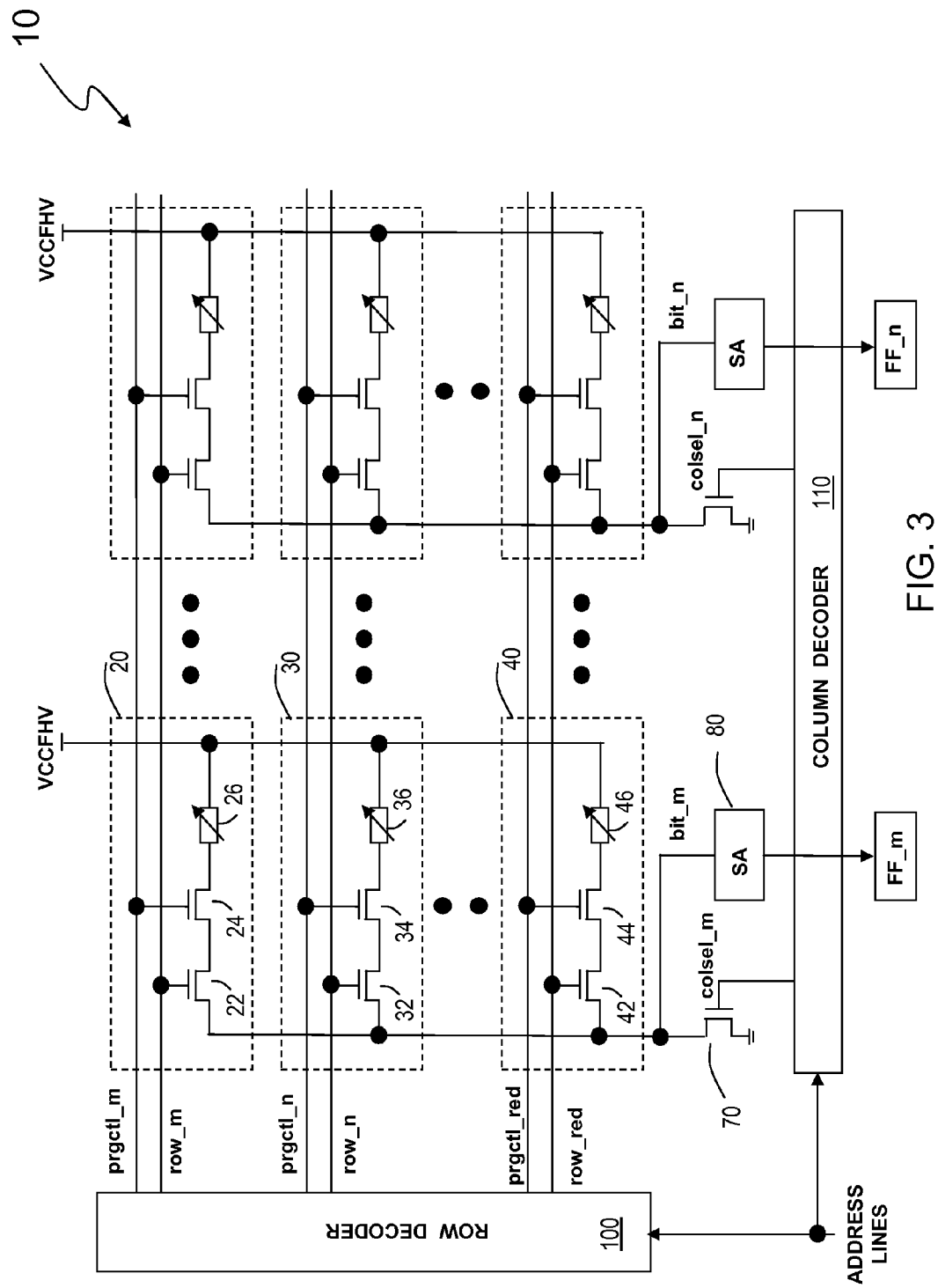
FIG. 3 is a diagram that shows an alternate embodiment of the PROM that includes an array of fuse bit cells in accordance with the present invention.

FIG. 3 is a diagram that shows an alternate embodiment of the PROM that does not have sleep PMOS transistors on the bit lines. Further note that in this embodiment a single-ended Sense Amp (SA) 80 is attached to the line labeled "FVSS" that connects with transistors 22, 32, and 42 in the respective fuse bit cells 20, 30, . . . , and 40.

Figure 4:
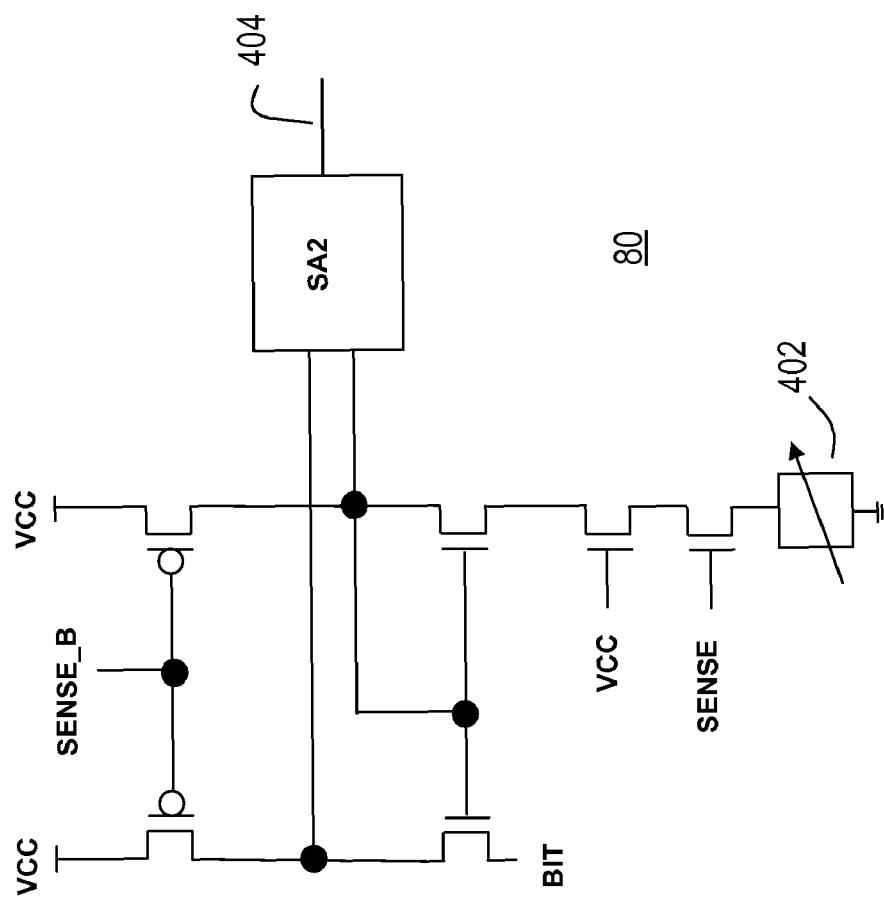
FIG. 4 illustrates a single-ended Sense Amp (SA) for use with the PROM architecture shown in FIG. 3 that receives a bit sensed signal of a fuse resistance from a selected fuse bit cell to compare with a reference fuse resistance.

FIG. 4 illustrates a single-ended Sense Amp (SA) 80 for use with the PROM architecture shown in FIG. 3. SA 80 receives a bit sensed signal of a fuse resistance from a selected fuse bit cell to compare with a reference fuse resistance 402. VCCFHV has a high voltage during programming but is maintained at a potential of Vss during sensing in a read operation. All column signals (colsel_m, colsel_n, etc.) are shut off after programming.

Figure 5:
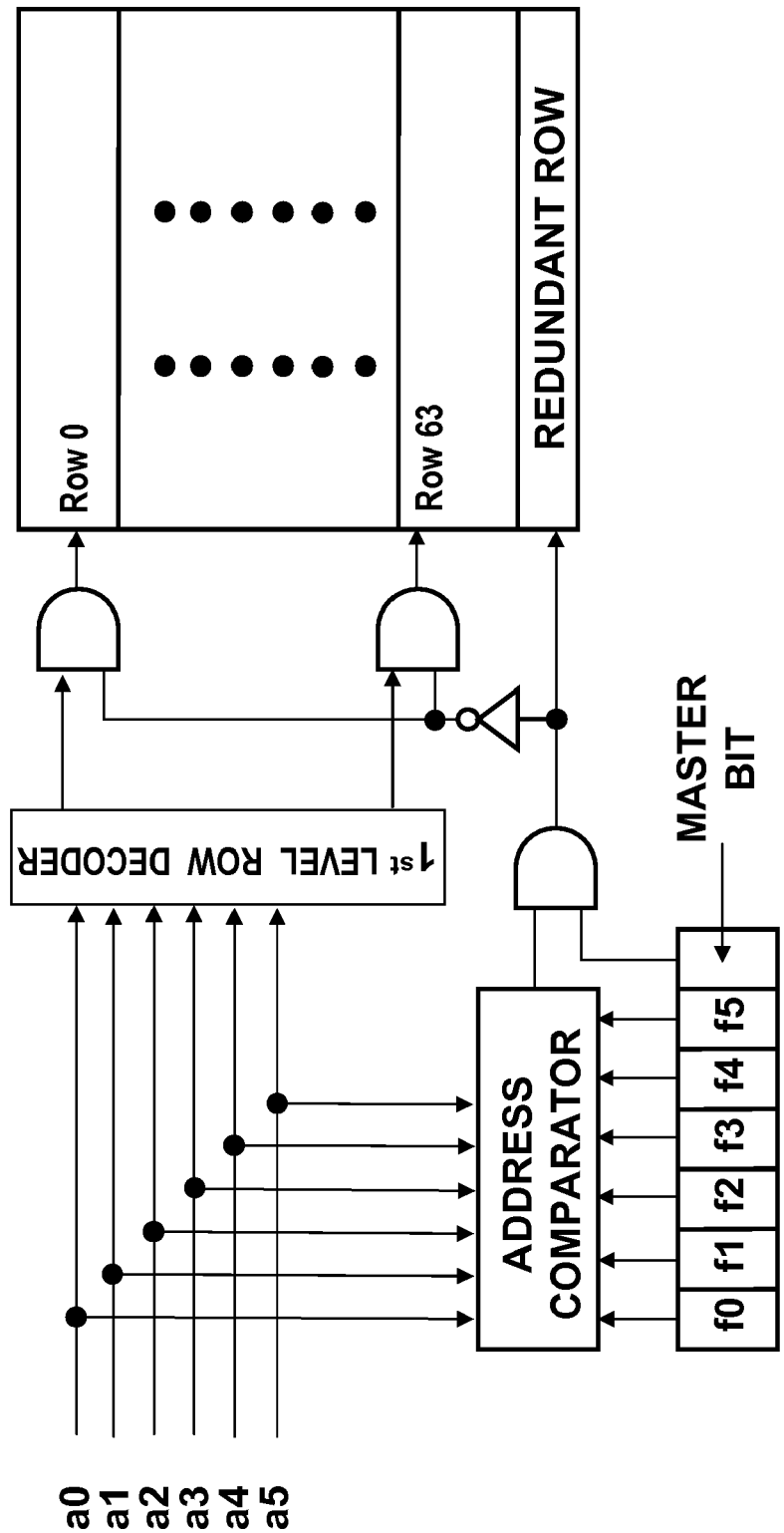
FIG. 5 shows a fuse redundancy scheme that may be used to repair a defective fuse row in accordance with the present invention.

FIG. 5 shows a fuse redundancy scheme that may be used to repair a defective fuse row. A single-ended fuse bit as a master bit enables the redundancy feature. By way of example, when the master bit has a value of ZERO, the redundancy feature is disabled. However, when a fuse bit cell is defective the master bit fuse can be programmed to a value of ONE to enable the redundancy feature. With the redundancy feature enabled, fuse bits in the redundant row (labeled as "prgctl_red" and "row_red" in FIGS. 1 and 3) can be programmed for the defective row address. Thus, the redundancy logic programs the redundant row instead of the defective row. Hence, defective rows can be repaired and the yield can be dramatically improved. Depending on the process and fuse yield target, one or more redundant rows are included to repair one or more defective rows to boost fuse yield.

By now it should be apparent that embodiments of the present invention allow increased cell area efficiencies and reduce leakage using sleep transistors to shut off the entire fuse array during standby. The fuse cell architecture includes a simple redundancy scheme that is easily adopted to repair defective fuse cells to boost the fuse program yield.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A programmable ROM (PROM), comprising:
    an array of fuse cells, wherein a fuse cell includes first and second cascode NMOS transistors connected to a programmable fuse;
    a bit line connecting the fuse cell to other fuse cells in a column of the array of fuse cells; and
    a sleep PMOS transistor connected to the bit line that in a standby mode of the PROM shut off the fuse cells in the column of the array.

2. The programmable ROM of claim 1, wherein the sleep PMOS transistor couples the bit line to a first power conductor in a programming mode and is non-conductive in the standby mode.

3. The programmable ROM of claim 1, further including a line to commonly connect the first cascade NMOS transistor in each cell along the column of the array of fuse cells.

4. The programmable ROM of claim 3, wherein the line is connected to a first sleep NMOS transistor that in a programming mode receives a column select signal and in the standby mode is non-conductive.

5. The programmable ROM of claim 4, wherein the line is further connected to a second sleep NMOS transistor that in a read mode receives a sense signal and in the standby mode is non-conductive.

6. The programmable ROM of claim 1, wherein the array of fuse cells includes a fuse redundancy scheme used to repair a defective fuse row in the fuse array.

7. A programmable ROM, comprising:
    fuse cells connected in a column by a bit line, wherein a fuse cell includes a first NMOS transistor and a second NMOS transistor serially connected to a programmable fuse; and
    a sleep PMOS transistor connected to the bit line that in a standby mode of the PROM shut off the fuse cells in the column of the array.

8. The programmable ROM of claim 7, wherein
the sleep PMOS transistor connected to the bit line that in a standby mode inhibits leakage current in the fuse cells and in a programming mode couples the bit line to a programming potential.

9. The programmable ROM of claim 7, wherein
the sleep NMOS transistor coupled to the first NMOS transistor in the fuse cells that when selected by a column decode in a programming mode conducts a current and in the standby mode is non-conductive.

10. The programmable ROM of claim 7 further comprising:
a second sleep NMOS transistor coupled to the first NMOS transistor in the fuse cells that when selected by a column decode in a read mode conducts a current and in the standby mode is non-conductive.

11. The programmable ROM of claim 7 further comprising:
a single-ended sense amp connected to the bit line that receives a signal sensed from a selected fuse cell.

12. The programmable ROM of claim 11 wherein the single-ended sense amp compares a sensed fuse resistance in the selected fuse cell with a reference fuse resistance provided by a fuse element in the single-ended sense amp.

13. The programmable ROM of claim 7 further comprising:
a single-ended sense amp connected to the first NMOS transistor in the fuse cells to receive a signal sensed from a selected fuse cell.

14. The programmable ROM of claim 7 wherein all fuse cells in a same row may be read at a same time.

15. The programmable ROM of claim 7 wherein a master bit fuse is programmed to enable a redundancy feature and fuse bits in a redundant row are programmed instead of a defective row.

16. A programmable ROM (PROM), comprising:
an array of fuse cells, wherein a fuse cell includes first and second cascode transistors connected to a programmable fuse;
a row decoder to supply a row select signal to a gate of the first cascade transistor and a program control signal to a gate of the second cascode transistor;
a bit line to connect the programmable fuse to other fuse cells in a column of the array of fuse cells;
a line to commonly connect source terminals of the first cascade transistor in a column of the array of fuse cells; and
a sleep PMOS transistor connected to the bit line that in a standby mode of the PROM shut off the fuse cells in the column of the array.

17. The programmable ROM (PROM) of claim 16, wherein
the sleep transistor connected to the bit line that in a standby mode inhibits leakage current in the fuse cell and in a programming mode couples the bit line to a programming potential.

18. The programmable ROM (PROM) of claim 16, further comprising:
a second sleep transistor that in a programming mode receives a column select signal and in a standby mode is non-conductive.

19. The programmable ROM (PROM) of claim 16, further comprising:
a third sleep transistor that in a read mode receives a sense signal and in a standby mode is non-conductive.

20. The programmable ROM (PROM) of claim 16, further comprising:
a single-ended sense amp connected to fuse cells located in a column of the array of fuse cells to compare a sensed fuse resistance in a selected fuse cell with a reference fuse resistance provided by a fuse element in the single-ended sense amp.

21. The programmable ROM (PROM) of claim 16 wherein a master bit fuse is programmed to enable a redundancy feature and fuse bits in a redundant row are programmed instead of a defective row.

* * * * *